United States Patent
Uchida et al.

(10) Patent No.: US 6,339,362 B1
(45) Date of Patent: Jan. 15, 2002

(54) MICROWAVE AMPLIFIER OPTIMIZED FOR STABLE OPERATION

(75) Inventors: Hiromitsu Uchida; Takeshi Ohshima; Yasushi Itoh, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/680,974

(22) Filed: Oct. 6, 2000

Related U.S. Application Data

(63) Continuation of application No. 09/333,030, filed on Jun. 15, 1999, now Pat. No. 6,130,580.

(30) Foreign Application Priority Data

Dec. 7, 1998 (JP) .......................................... 10-347519

(51) Int. Cl.[7] .................................................. H03F 3/60
(52) U.S. Cl. ...................................................... 330/286
(58) Field of Search ................................ 330/286, 302, 330/306; 333/32, 33, 263

(56) References Cited

U.S. PATENT DOCUMENTS

| | | | | |
|---|---|---|---|---|
| 5,172,074 A | * | 12/1992 | Shiga | 330/286 X |
| 5,642,080 A | * | 6/1997 | Whang et al. | 330/286 X |
| 6,011,446 A | * | 1/2000 | Woods | 330/286 X |
| 6,130,580 A | * | 10/2000 | Uchida et al. | 330/286 |

FOREIGN PATENT DOCUMENTS

| | | | |
|---|---|---|---|
| JP | 61285811 | 12/1986 | |
| JP | 0145810 | * 6/1991 | 330/286 |
| JP | 575361 | 3/1993 | |
| JP | 6188653 | 7/1994 | |
| JP | 6276038 | 9/1994 | |

OTHER PUBLICATIONS

Nakayama, M., Technical Report of IEICE, The Institute of Electronics Information and Communication Engineers, "Low–Noise Amplifier Using Directly Cooled HEMTs", Feb. 1993, pp. 49–54.

* cited by examiner

*Primary Examiner*—Steven J. Mottola
(74) *Attorney, Agent, or Firm*—Rothwell, Figg, Ernst & Manbeck

(57) ABSTRACT

By connecting a grounding conductor pattern directly to a grounding terminal of a field-effect transistor and connecting a series circuit comprising a stabilized resistor and an open-circuit stub having a length equal to quarter of a parallel resonance frequency, undesirable parallel resonance caused by the grounding conductor pattern and the open-circuit stub is suppressed, and a voltage drop in the stabilized resistor is suppressed when a bias voltage is applied to the field-effect transistor. Accordingly, the operation of a microwave amplifier is stabilized.

3 Claims, 2 Drawing Sheets

MICROWAVE AMPLIFIER OPTIMIZED FOR STABLE OPERATION

This application is a continuation of application Ser. No. 09/333,030 filed Jun. 15, 1999, now U.S. Pat. No. 6,130,580.

BACKGROUND OF THE INVENTION

1. Field of the Invention

The present invention generally relates to microwave amplifiers and, more particularly, to a microwave amplifier implemented by a transistor for amplifying signals having a millimeter-wave frequency or a microwave frequency.

2. Description of the Related Art

FIG. 4 is a circuit diagram of a microwave amplifier according to the related art disclosed, for example, in Japanese Laid-Open Patent Application No. 61-285811. Referring to FIG. 4, the microwave amplifier comprises a field-effect transistor 1 having a relatively high operating frequency, a grounding terminal 2 for the field-effect transistor 1, a stabilized resistor 3 connected to the grounding terminal 2, a grounding conductor pattern 4 having one end thereof connected to the stabilized resistor 3 and the other end grounded, and an open-circuit stub 5 having a length equal to ¼ of a wavelength at the operating frequency of the field-effect transistor 1 and connected to the grounding terminal 2 so as to be parallel with a series circuit formed of the stabilized resistor 3 and the grounding conductor pattern 4.

A description will now be given of the operation of the microwave amplifier of FIG. 4.

The microwave amplifier shown in FIG. 4 operates such that a drain current from the drain D to the source S of the field-effect transistor 1 is amplified in accordance with a gate voltage applied to the gate G.

The grounding conductor pattern 4 is a channel by which the grounding terminal 2 of the field-effect transistor 1 is grounded. In a low-frequency band, the inductance of the grounding conductor pattern 4 is negligible so that the field-effect transistor 1 is properly grounded. In a high-frequency band, the inductance of the grounding conductor pattern 4 is not negligible. The grounding conductor pattern 4 thus acts as a short-circuited stub having inductance, resulting in a loss of the gain of the field-effect transistor 1 due to the inductance of the grounding conductor pattern 4.

Accordingly, the open-circuit stub 5 having a length equal to ¼ of the wavelength at the operating frequency of the microwave amplifier is connected to the grounding terminal 2 to provide high-frequency grounding of the grounding terminal 2 at the operating frequency.

However, at certain points in the high-frequency band including the operating frequency, the inductance of the grounding conductor pattern 4 and the capacitance of the open-circuit stub 5 produce parallel resonance, causing the reactance of the grounding terminal 2 to become infinite at the parallel resonance frequency.

The stabilized resistor 3 is connected between the grounding terminal 2 and the grounding conductor pattern 4 in order to suppress parallel resonance at the parallel resonance frequency.

FIG. 5 is a circuit diagram of a microwave amplifier according to the related art shown in TECHNICAL REPORT OF IEICE (THE INSTITUTE OF ELECTRONICS, INFORMATION AND COMMUNICATION ENGINEERS) MW 92-149 LOW-NOISE AMPLIFIER USING DIRECTLY COOLED HEMTs, FEBRUARY, 1993. Referring to FIG. 5, the microwave amplifier includes the field-effect transistor 1, the grounding terminal 2 of the field-effect transistor 1, and the inductor 7 having one end thereof connected to the grounding terminal 2 and the other end grounded.

A description will now be given of the operation of the microwave amplifier of FIG. 5.

The microwave amplifier shown in FIG. 5 operates such that a drain current from the drain D to the source S of the field-effect transistor 1 is amplified in accordance with a gate voltage applied to the gate G.

The inductor 7 can be configured such that the impedance that minimizes the noise for the field-effect transistor 1 substantially matches the impedance that minimizes reflection. Thus, the noise characteristic and the reflection characteristic can be simultaneously improved.

The microwave amplifier of FIG. 4 has a drawback in that the stabilized resistor 3 produces a voltage drop when a bias is applied to the field-effect transistor 1. This makes it difficult to use the construction as shown in FIG. 4 in a high-power amplifier having a large current consumption.

The microwave amplifier of FIG. 5 has a drawback in that when a member having inductance and capacitance is used to implement the inductor 7, parallel resonance results at a certain frequency (parallel resonance frequency) so that the reactance of the grounding terminal 2 becomes infinity at the parallel resonance frequency. If this occurs, the operation of the microwave amplifier becomes unstable.

SUMMARY OF THE INVENTION

Accordingly, an object of the present invention is to provide microwave amplifiers in which the aforementioned drawbacks are eliminated.

Another and more specific object of the present invention is to provide a microwave amplifier optimized for stable operation.

The aforementioned objects can be achieved by a microwave amplifier comprising: a transistor for amplifying an input current; a grounding conductor pattern having one end thereof connected to a grounding terminal of said transistor and the other end grounded; a first open-circuit stub having a length equal to one quarter of a wavelength at an operating frequency of said transistor and connected to the grounding terminal of said transistor so as to be placed in parallel with said grounding conductor pattern; a resistor having one end thereof connected to the grounding terminal of said transistor so as to be placed in parallel with said grounding conductor pattern; and a second open-circuit stub having a length equal to one quarter of a parallel resonance frequency of said grounding conductor pattern and said first open-circuit stub, and connected to the other end of said resistor.

Accordingly, it is not only possible to suppress undesirable parallel resonance caused by the inductance of the grounding conductor pattern and the capacitance of the first open-circuit stub, but also to prevent a voltage drop in the stabilized resistor when a bias is applied to a transistor. Thus, a microwave amplifier optimized for stable operation and applicable to a high-power amplifier having a large current consumption is obtained.

The aforementioned objects can also be achieved by a microwave amplifier comprising: a transistor for amplifying an input current; an inductor having one end thereof connected to a grounding terminal of said transistor and the other end grounded; a resistor having one end thereof connected to the grounding terminal of said transistor so as to be placed in parallel with said inductor; and an open-circuit stub having a length equal to a quarter of a parallel resonance frequency of an inductance of said inductor and a capatitance inherent in a member constituting an inductor, and connected to the other end of said resistor.

Accordingly, it is not only possible to suppress undesirable parallel resonance caused by the inductance of the grounding conductor pattern and the capacitance of the first open-circuit stub, but also to prevent a voltage drop in the stabilized resistor when a bias is applied to a transistor. Thus, a microwave amplifier optimized for stable operation and applicable to a high-power amplifier having a large current consumption is obtained.

The aforementioned objects can also be achieved by a microwave amplifier comprising: a transistor for amplifying an input current; an inductor having one end thereof connected to a grounding terminal of said transistor and the other end grounded; a resistor having one end thereof connected to the grounding terminal of said transistor so as to be placed in parallel with said inductor; and an open-circuit stub having a length equal to a quarter of a parallel resonance frequency of an inductance of said inductor and a capatitance inherent in a member constituting an inductor, and connected to the other end of said resistor.

Accordingly, undesirable parallel resonance caused by inductance and capacitance of a member constituting an inductor is suppressed so that the stable operation of a microwave amplifier is achieved.

BRIEF DESCRIPTION OF THE DRAWINGS

Other objects and further features of the present invention will be apparent from the following detailed description when read in conjunction with the accompanying drawings, in which.

DETAILED DESCRIPTION OF THE PREFERRED EMBODIMENTS

Embodiment 1

Figure 1:
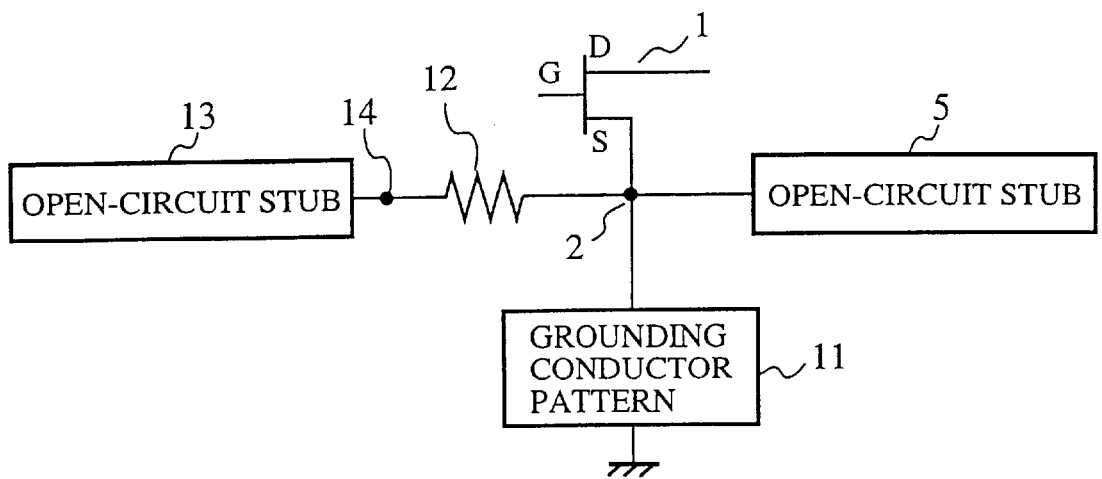
FIG. 1 is a circuit diagram of a microwave amplifier according to a first embodiment of the present invention.
Figure 4:
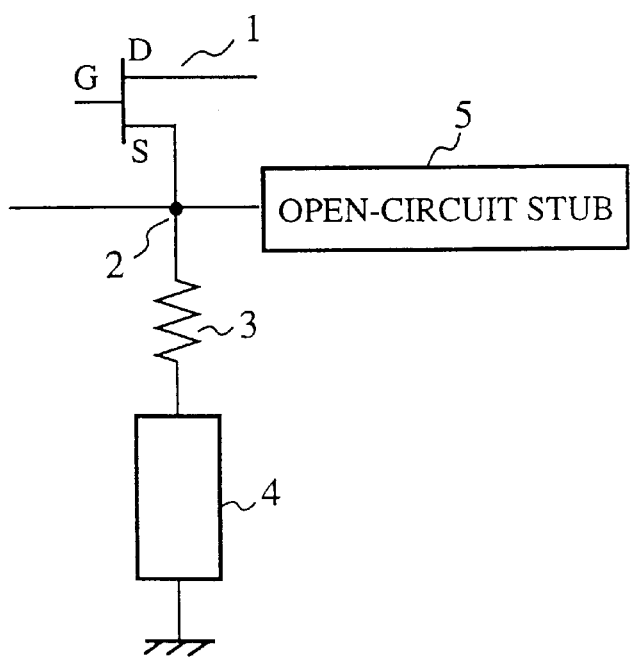
FIG. 4 is a circuit diagram of a microwave amplifier according to the related art.

FIG. 1 is a circuit diagram of a microwave amplifier according to the first embodiment. Referring to FIG. 1, the microwave amplifier comprises a field-effect transistor 1, a grounding terminal 2 for the field-effect transistor 1, a first open-circuit stub 5 having a length equal to ¼ of a wavelength at the operating frequency of the field-effect transistor 1. The components listed above are the same as the corresponding components of FIG. 4

The microwave amplifier of FIG. 1 further comprises a grounding conductor pattern 11 having one end thereof connected to the grounding terminal 2 and the other end grounded, a stabilized resistor 12 having one end thereof connected to the grounding terminal 2 so as to be parallel with the grounding conductor pattern 11, and a second open-circuit stub 13 having a length equal to ¼ of a wavelength at a parallel resonance frequency of the grounding conductor pattern 11 and the first open-circuit stub 5, and connected to a junction 14 at the other end of the stabilized resistor 12.

A description will now be given of the operation of the microwave amplifier.

The microwave amplifier shown in FIG. 1 operates such that a drain current from the drain D to the source S of the field-effect transistor 1 is amplified in accordance with a gate voltage applied to the gate G.

The grounding conductor pattern 11 is a channel by which the grounding terminal 2 is grounded. In a low-frequency band, the inductance of the grounding conductor pattern 11 is negligible so that the field-effect transistor 1 is properly grounded. In a high-frequency band, the inductance of the grounding conductor pattern 11 is not negligible. The grounding conductor pattern 11 thus acts as a short-circuited stub, resulting in a loss of the gain of the field-effect transistor 1 due to the inductance of the grounding conductor pattern 11.

Accordingly, the open-circuit stub 5 having a length equal to ¼ of the wavelength at the operating frequency of the microwave amplifier is connected to the grounding terminal 2 to provide high-frequency grounding of the grounding terminal 2 at the operating frequency.

However, at certain points in the high-frequency band including the operating frequency, the inductance of the grounding conductor pattern 11 and the capacitance of the open-circuit stub 5 produce parallel resonance, causing the reactance of the grounding terminal 2 to become infinite at the parallel resonance frequency. As a result, the field-effect transistor 1 becomes unstable in the neighborhood of the parallel resonance frequency, producing an undesirable oscillation.

The first embodiment resolves this drawback by connecting a series circuit including the stabilized resistor 12 and the open-circuit stub 13 to the grounding terminal 2. Since the open-circuit stub 13 has a length equal to ¼ of the wavelength at the parallel resonance frequency, the series circuit provides high-frequency grounding of the junction 14 at the parallel resonance frequency. Since the junction 14 is provided with high-frequency grounding at the parallel resonance frequency, connection of the stabilized resistor 12 to the parallel circuit comprising the grounding conductor pattern 11 and the first open-circuit stub 5 prevents undesirable resonance at the parallel resonance frequency.

Thus, the construction according to the first embodiment prevents undesirable parallel resonance caused by the inductance of the grounding conductor pattern 11 and the capacitance of the first open-circuit stub 5. Added to this is an effect of elimination of a voltage drop across, the stabilized resistor 3 of the related art. Thereby, a stable operation of the microwave amplifier results. As such, the construction of the first embodiment is applicable to a high-power amplifier with a large current consumption.

While it has been assumed that the microwave amplifier uses a field-effect transistor 1, the benefit of the first embodiment is also available when a bipolar transistor is used.

Embodiment 2

Figure 2:
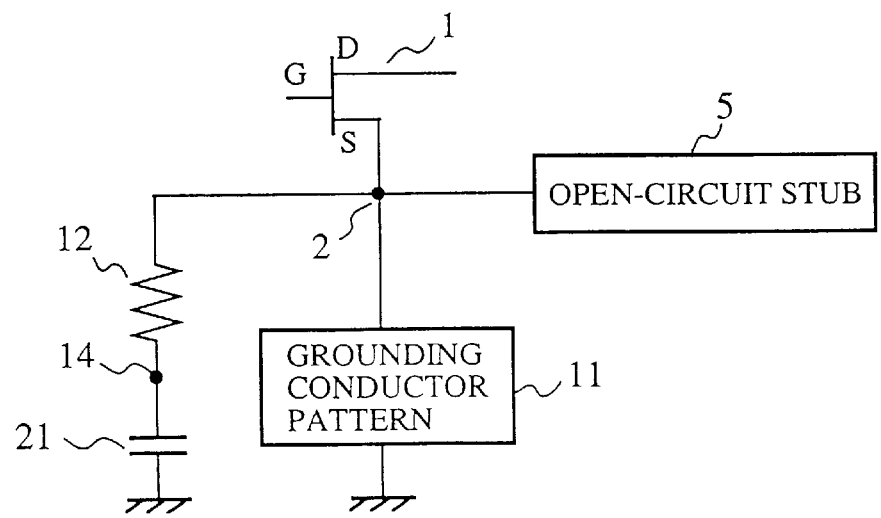
FIG. 2 is a circuit diagram of a microwave amplifier according to a second embodiment of the present invention.

FIG. 2 is a circuit diagram of the microwave amplifier according to the second embodiment. Referring to FIG. 2, the microwave amplifier includes a capacitor 21 having one end thereof connected to the stabilized resistor 12 and the other end grounded.

The other aspects of the illustrated construction are the same as the corresponding aspects shown in FIG. 1, and the description thereof is omitted.

A description will now be given of the operation.

In the first embodiment, the second open-circuit stub 13 having a length equal to ¼ of the parallel resonance frequency of the grounding conductor pattern 11 and the first open-circuit stub 5 is used to provide grounding of the junction 14 connected to the stabilized resistor 12. In the second embodiment, the capacitor 21 is used to ground the junction 14 connected to the stabilized resistor 12.

The requirement for the capacitor 21 is that it is capable of storing a sufficient amount of charge at the parallel resonance frequency. That is, it is required that the capacitance of the capacitor 21 be larger than a level sufficient to provide simulated grounding of the junction 14.

More specifically, the requirement is represented as $$1/j2\pi f_0 C \ll R$$

where $f_0$ indicates a parallel resonance frequency, C indicates a capacitance of the capacitor 21 and R indicates a resistance of the stabilized resistor 12.

With the junction 14 grounded by the capacitor 21 at the parallel resonance frequency, the stabilized resistor 12 is connected to a parallel circuit comprising the grounding conductor pattern 11 and the first open-circuit stub 5 so that undesirable parallel resonance at the parallel resonance frequency is suppressed.

Thus, like the construction according to the first embodiment, the construction according to the second embodiment suppresses undesirable parallel resonance caused by the inductance of the grounding conductor pattern 11 and the capacitance of the first open-circuit stub 5. Added to this is an effect of elimination of a voltage drop across the stabilized resistor 3 of the related art when a bias is applied to the field-effect transistor 1. Thereby, stable operation of the microwave amplifier results. As such, the construction of the second embodiment is applicable to a high-power amplifier with a large current consumption.

By constructing the capacitor 21 using a chip capacitor or a MIM capacitor, the size of the microwave amplifier is reduced.

Embodiment 3

Figure 3:
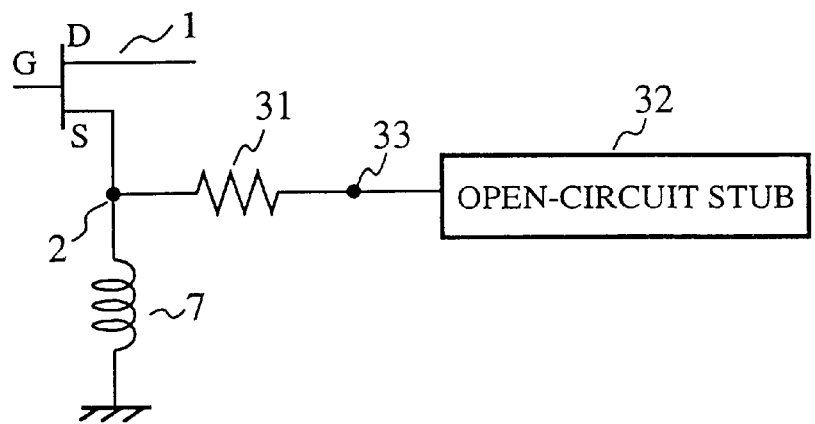
FIG. 3 is a circuit diagram of a microwave amplifier according to a third embodiment.
Figure 5:
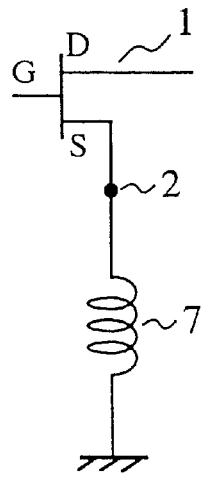
FIG. 5 is a circuit diagram of another microwave amplifier according to the related art.

FIG. 3 is a circuit diagram of the microwave amplifier according to the third embodiment. Referring to FIG. 3, the microwave amplifier comprises a field-effect transistor 1, a grounding terminal 2 for the field-effect transistor 1, and an inductor 7 having one end thereof connected to the grounding terminal 2 and the other end grounded. The components listed above are the same as the corresponding components shown in FIG. 5

The microwave amplifier according to the third embodiment also comprises a stabilized resistor 31 having one end thereof connected to the grounding terminal 2 so as to be parallel with the inductor 7, an open-circuit stub 32 having a length equal to ¼ of a wavelength at a parallel resonance frequency of the inductor 7 and the capacitance inherent in a member implementing the inductor 7 and connected to a junction 33 at the other end of the stabilized resistor 31.

A description will now be given of the operation of the microwave amplifier.

The microwave amplifier shown in FIG. 3 operates such that a drain current from the drain D to the source S of the field-effect transistor 1 is amplified in accordance with a gate voltage applied to the gate G.

The inductor 7 can be configured such that the impedance that minimizes the noise for the field-effect transistor 1 substantially matches the impedance that minimizes reflection. Thus, the noise characteristic and the reflection characteristic can be simultaneously improved.

The inductor 7 is implemented by a distributed constant element such as an open-circuit stub or a spiral inductor, or a lumped constant element such as a chip inductor. At certain points in a frequency band that includes the operating frequency of the microwave amplifier, the inductance of the inductor 7 and the parasitic capacitance inherent in the member implementing the inductor 7 produce parallel resonance. As a result, the reactance of the grounding terminal 2 becomes infinite at the parallel resonance frequency. If this occurs, the operation of the field-effect transistor 1 becomes unstable in the neighborhood of the parallel resonance frequency, causing undesirable oscillation.

Accordingly, a series circuit comprising the stabilized resistor 31 and the open-circuit stub 32 is connected to the grounding terminal 2. Since the open-circuit stub 32 has a length equal to ¼ of the wavelength at the parallel resonance frequency, the open-circuit stub 32 provides grounding of the junction 33 between the stabilized resistor 31 and the open-circuit stub 32. By grounding the junction 33 at the parallel resonance frequency, the stabilized resistor 31 is connected to a parallel circuit that includes the inductance of the inductor 7 and the associated capacitance. Therefore, undesirable parallel resonance at the parallel resonance frequency is suppressed.

With the benefit of suppressed parallel resonance caused by the inductance of the inductor 7 and the associated capacitance, a stable operation of the microwave amplifier results.

While it has been assumed that the microwave amplifier uses a field-effect transistor 1, the benefit of the third embodiment is also available when a bipolar transistor is used.

The present invention is not limited to the above-described embodiments, and variations and modifications may be made without departing from the scope of the present invention.

What is claimed is:

1. In a microwave amplifier having a transistor for amplifying an input current and a first grounding circuit connected to a grounding terminal of said transistor for grounding said grounding terminal at an operating frequency of said transistor, said first grounding circuit including a grounding conductor pattern connected to ground and an open-circuit stub connected to said grounding terminal, the improvement comprising:

a second grounding circuit connected to said grounding terminal in parallel with said first grounding circuit for grounding said grounding terminal of said transistor at a parallel resonance frequency of said first grounding circuit.

2. In a microwave amplifier according to claim 1, wherein said second grounding circuit comprises an open-circuit stub having a length equal to a quarter of a wavelength of said parallel resonance frequency.

3. In a microwave amplifier according to claim 1, wherein said second grounding circuit comprises a stabilized resistor in series with a capacitor having a capacitance sufficient for holding a charge at said parallel resonance frequency so as to provide grounding of said grounding terminal at said parallel resonance frequency.

\* \* \* \* \*